United States Patent [19]
Luiz

[11] Patent Number: 6,018,702
[45] Date of Patent: Jan. 25, 2000

[54] TUNED FILTER CALIBRATION SYSTEM

[75] Inventor: David A. Luiz, Sebastopol, Calif.

[73] Assignee: Hewlett-Packard Company, Palo Alto, Calif.

[21] Appl. No.: 09/102,294

[22] Filed: Jun. 22, 1998

[51] Int. Cl.[7] .................................................. G01R 27/00
[52] U.S. Cl. ........................... 702/107; 702/112; 702/66; 702/190; 324/76.29
[58] Field of Search ..................................... 702/107, 112, 702/66, 190; 324/619, 636, 613, 416, 76.29; 455/226.1; 329/322

[56] References Cited

U.S. PATENT DOCUMENTS

| | | | |
|---|---|---|---|
| 4,149,122 | 4/1979 | Parato ................................... | 455/226.1 |
| 4,607,215 | 8/1986 | Takano et al. ......................... | 324/76.23 |
| 4,858,159 | 8/1989 | Wheelwright et al. ................. | 702/106 |
| 5,416,422 | 5/1995 | Dildine ................................... | 324/416 |

Primary Examiner—Marc S. Hoff
Assistant Examiner—Hien Vo
Attorney, Agent, or Firm—John L. Imperato

[57] ABSTRACT

A filter calibration system uses the reflection characteristics of a tuned filter, such as a YIG-tuned filter (YTF), to establish a correspondence between a control signal applied to the filter and the passband center frequency of the filter. This correspondence enables tuning characteristic of a YTF stored during a baseline characterization of a spectrum analyzer to be corrected to compensate for temperature changes and changes in operating parameters of the spectrum analyzer. The filter calibration system uses components within the spectrum analyzer to perform the calibration so that the manufacturing cost of the spectrum analyzer is not increased. The spectrum analyzer's local oscillator provides a stimulus signal that is applied to the YTF. A mixer within the spectrum analyzer detects reflections of the stimulus signal by the YTF while control signals applied to the YTF are varied to correspondingly adjust the passband center frequency of the YTF. The detected reflections from the YTF at the various control signal levels are recorded and characteristics of this reflection response are used to map the control signal levels to the center frequencies of the YTF to compensate for changes in the tuning characteristic of the YTF.

20 Claims, 5 Drawing Sheets

TUNED FILTER CALIBRATION SYSTEM

BACKGROUND OF THE INVENTION

Tuned filters that have broad tuning range and high signal selectivity are used in spectrum analyzers and other measurement systems. The passband center frequency of a tuned filter is adjustable via control signals that are applied to the filter. In a spectrum analyzer, measurement accuracy and dynamic range depend upon how accurately the control signals can tune or adjust the center frequency of the filter to track other signals such as the local oscillator signal within the spectrum analyzer. Typically, the tuning characteristic of a tuned filter, such as a yttrium-iron-garnet (YIG) tuned filter or YTF, is obtained and stored in memory during a baseline characterization of the spectrum analyzer. The stored tuning characteristic determines the control signal level needed to achieve a specified passband center frequency. However, temperature variations and changes in operating parameters of the spectrum analyzer alter the tuning characteristic of a YTF so that accurate adjustment of the center frequency of the YTF is not achieved using the tuning characteristic stored in memory.

Various calibration schemes have been used to compensate for changes in the tuning characteristic of the YTF relative to the tuning characteristic stored in memory. In a first calibration scheme microwave signals supplied by an external signal source are injected into the YTF at predefined frequencies within the tuning range of the YTF. Based on the transmission properties of the YTF at the predefined frequencies, a correspondence between center frequencies and control signal levels is obtained. This correspondence is used to determine the control signal levels needed to accurately adjust the center frequency of the YTF so that tracking between the center frequency and the local oscillator signal in the spectrum analyzer is provided. This calibration scheme relies on an external signal source and requires physically connecting the source to the YTF each time the calibration is performed, which is time-consuming. In a second calibration scheme microwave signals supplied by an internal signal source, such as a comb generator, are injected into the YTF at predefined frequencies within the tuning range of the YTF. In this scheme, the transmission properties of the YTF are also used to obtain a correspondence between the center frequencies of the YTF and control signal levels. However, the internal signal source increases the manufacturing cost of the spectrum analyzer. This calibration scheme is also time-consuming because it involves physically rerouting signal paths within the spectrum analyzer to apply the microwave signals from the internal signal source to the YTF.

Typically, temperature and operating parameters of a spectrum analyzer vary as measurements are performed. Therefore, the tuning characteristic stored in memory during the baseline characterization requires correction or calibration sufficiently often to assure that the center frequency of the YTF can be accurately adjusted so that accurate tracking to the local oscillator signal is provided. Accordingly, there is a need for a filter calibration system that can calibrate the tuning characteristics of a tuned filter, such as a YTF, in a time-efficient manner without increasing the manufacturing cost of the spectrum analyzer.

SUMMARY OF THE INVENTION

According to the preferred embodiment of the present invention, a filter calibration system within a spectrum analyzer uses the reflection response of a tuned filter to establish a correspondence between a control signal applied to the filter and the passband center frequency of the filter. This correspondence enables the tuning characteristic of a tuned filter, such as a YIG-tuned filter (YTF), stored in memory during a baseline characterization of the spectrum analyzer to be calibrated or corrected to compensate for temperature changes and changes in operating parameters of the spectrum analyzer. Accurate adjustment of the center frequency of the YTF provides tracking between the center frequency and other signals, such as a local oscillator signal, enabling the spectrum analyzer to have high measurement accuracy and high dynamic range. Calibration of the tuning characteristic of the YTF is performed quickly without reconfiguring signal paths and since the filter calibration system uses components within the spectrum analyzer, the manufacturing cost of the spectrum analyzer is not increased. The spectrum analyzer's local oscillator provides a stimulus signal that is applied to the YTF. A mixer within the spectrum analyzer detects reflections of the stimulus signal by the YTF while control signals applied to the YTF are varied to correspondingly adjust the passband center frequency of the YTF. The detected reflections from the YTF at various control signal levels are recorded and characteristics of this reflection response are used to map the control signal levels to the center frequencies of the YTF to compensate for changes in the tuning characteristic of the YTF.

DETAILED DESCRIPTION OF THE PREFERRED EMBODIMENT

Figure 1:
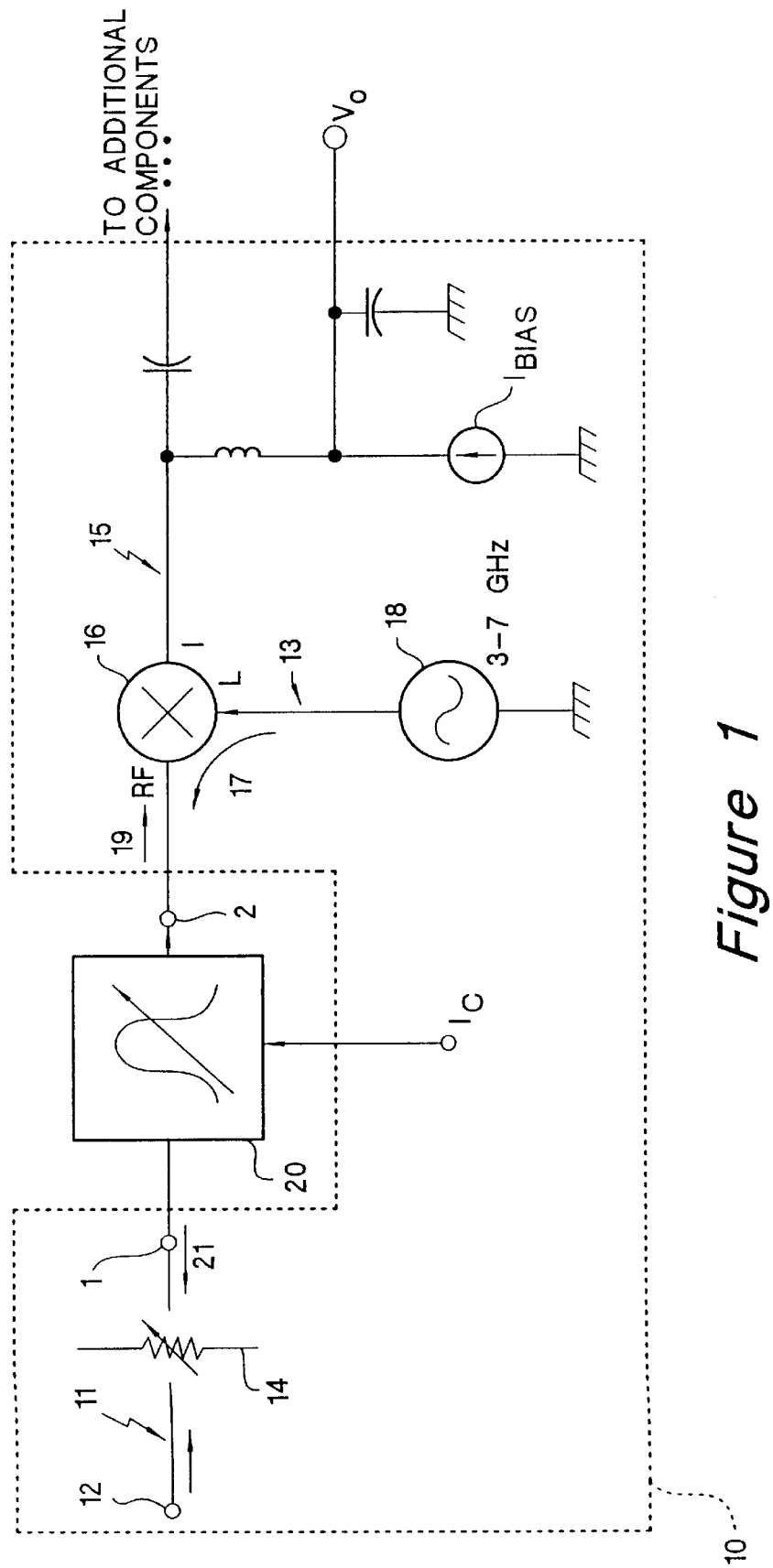
FIG. 1 shows the filter calibration system constructed according to the preferred embodiment of the present invention.

FIG. 1 shows a filter calibration system 10 constructed according to the preferred embodiment of the present invention. The components of the filter calibration system 10 are internal to a spectrum analyzer or other type of measurement system. When a spectrum analyzer is operated in a measurement mode, signals 11 to be analyzed are applied to the input 12 of the spectrum analyzer. An attenuator 14 reduces the amplitude of the applied signal 11 as necessary to prevent over driving circuitry within the spectrum analyzer. After propagating through the attenuator 14 the signal 11 is incident at the input 1 of a tuned filter 20. In this example the tuned filter 20 is a YIG-tuned filter (YTF) 20. The passband center frequency of the YTF 20 and the frequency of a local oscillator signal 13, provided by a local oscillator 18, are swept over a preset frequency range to select and downconvert spectral segments of the applied signal 11. A downconverted signal 15 at the I port of a mixer 16 is further processed, analyzed and displayed using additional components (not shown) within the spectrum analyzer. A control signal, which in this example is a control current $I_c$, applied to the YTF 20 tunes the passband center frequency of the YTF to track the frequency of the local oscillator 18. Measurement accuracy and dynamic range of the spectrum analyzer depend upon how accurately the control signal $I_c$ can tune the center frequency of the YTF 20 to track the frequency of the local oscillator signal 13. Accurate tuning of the center frequency of the YTF relies on a characterization of the relationship between the center frequency of the YTF 20 and the control current $I_c$ applied to the YTF.

Figure 2:
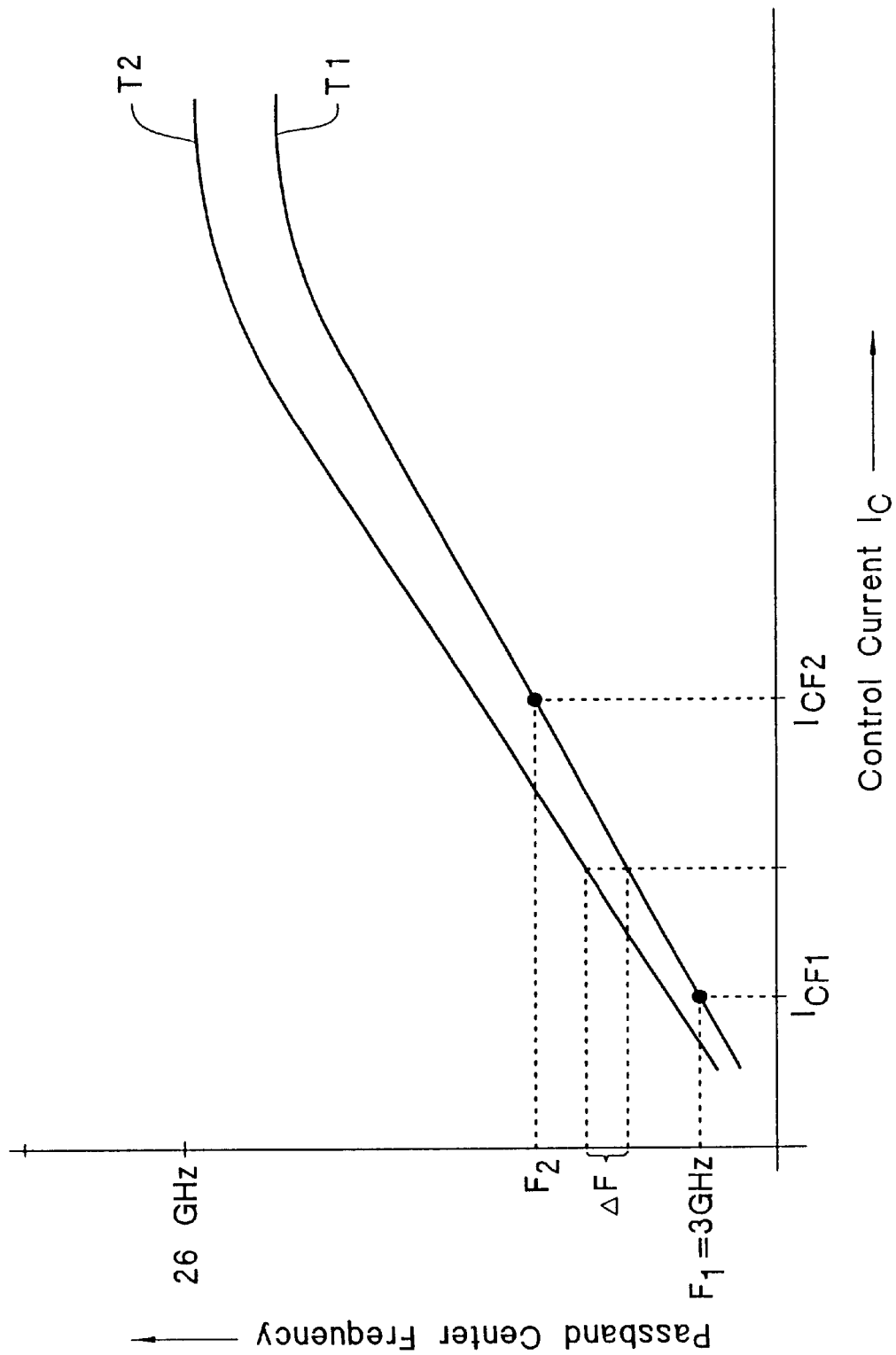
FIG. 2 shows tuning characteristics of a YTF.

FIG. 2 shows the relationship between the control current $I_c$ and the passband center frequency of the YTF 20 at two operating temperatures, corresponding to traces T1 and T2. The tuning characteristic of the YTF shown in trace T1 is determined by a baseline characterization of the spectrum analyzer performed at a baseline temperature. During the baseline characterization signals are applied to the YTF 20 at predefined frequencies within the tuning range of the YTF and the control current $I_c$ is adjusted at each of the frequencies until transmission through the passband of the YTF is maximized. The resulting levels of the control current $I_c$ at the transmission maximum at each of the predefined frequencies is stored in memory. The relationship between the predefined frequencies and the corresponding control current levels stored in memory enables the YTF 20 to be set to specified center frequencies within the tuning range of the YTF by applying the appropriate control currents $I_c$ to the YTF 20. However, the tuning characteristic of the YTF 20 depends on operating temperature, aging of components within the spectrum analyzer, and operating parameters of the spectrum analyzer. Trace T2 shows the tuning characteristic of the YTF at an operating temperature that is different from the baseline temperature shown in trace T1 which is stored in memory. The difference in tuning characteristics between trace T1 and trace T2 causes an error $\Delta F$ in the center frequency of the YTF 20 when the center frequency is adjusted by applying a control current $I_c$ based on the tuning characteristic of trace T1 stored in memory.

The filter calibration system 10 calibrates or corrects the tuning characteristic of the YTF 20 as necessary to assure that the applied control current Ic tunes the center frequency of the YTF 20 to the specified frequency. For example, the filter calibration system 10 may correct the tuning characteristic that was stored in memory during the baseline characterization when the operating temperature deviates from the baseline temperature by a predetermined amount, or when designated changes in operating parameters of the spectrum analyzer occur.

Calibration or correction to the tuning characteristic of trace T1 is performed using the filter calibration system 10 shown in FIG. 1 while the spectrum analyzer is operated in a calibration mode. In the calibration mode, the local oscillator 18 provides a local oscillator signal 13 to the L port of the mixer 16. The local oscillator signal 13 propagates to the RF port of the mixer 16 to provide a stimulus signal 17 that is incident on the output port 2 of the YTF 20. Stimulus signal 17 produces a reflected signal 19 at the output port 2 of the YTF 20 and produces a transmitted signal 21 at the input port of the YTF 20. The attenuator 14 is set to a sufficiently high attenuation level to provide a good impedance match to transmitted signal 21, to minimize reflections from the input 12 of the spectrum analyzer and to reduce the amplitude of the transmitted signal 21 at the input 12.

The reflected signal 19 is incident on the mixer 16, which in this example is a double-balanced mixer. When biased by a current source $I_{BIAS}$, the mixer 16 functions as a detector, producing a detected voltage $V_o$ at the I port of the mixer that is proportional to the amplitude of the reflected signal 19. The amplitude of the reflected signal 19 and the detected voltage $V_o$ depend on the relative alignment of the passband center frequency of the YTF 20 and the frequency of the local oscillator signal 13. The relative alignment is varied by sweeping the control current Ic applied to the YTF 20 within a predefined current range $\Delta I_c$ to produce a corresponding deviation in the passband center frequency. Alternatively, the relative alignment is varied by maintaining the control current $I_c$ at a fixed level while varying the frequency of the local oscillator 18 within a predefined frequency range.

Figure 3A:
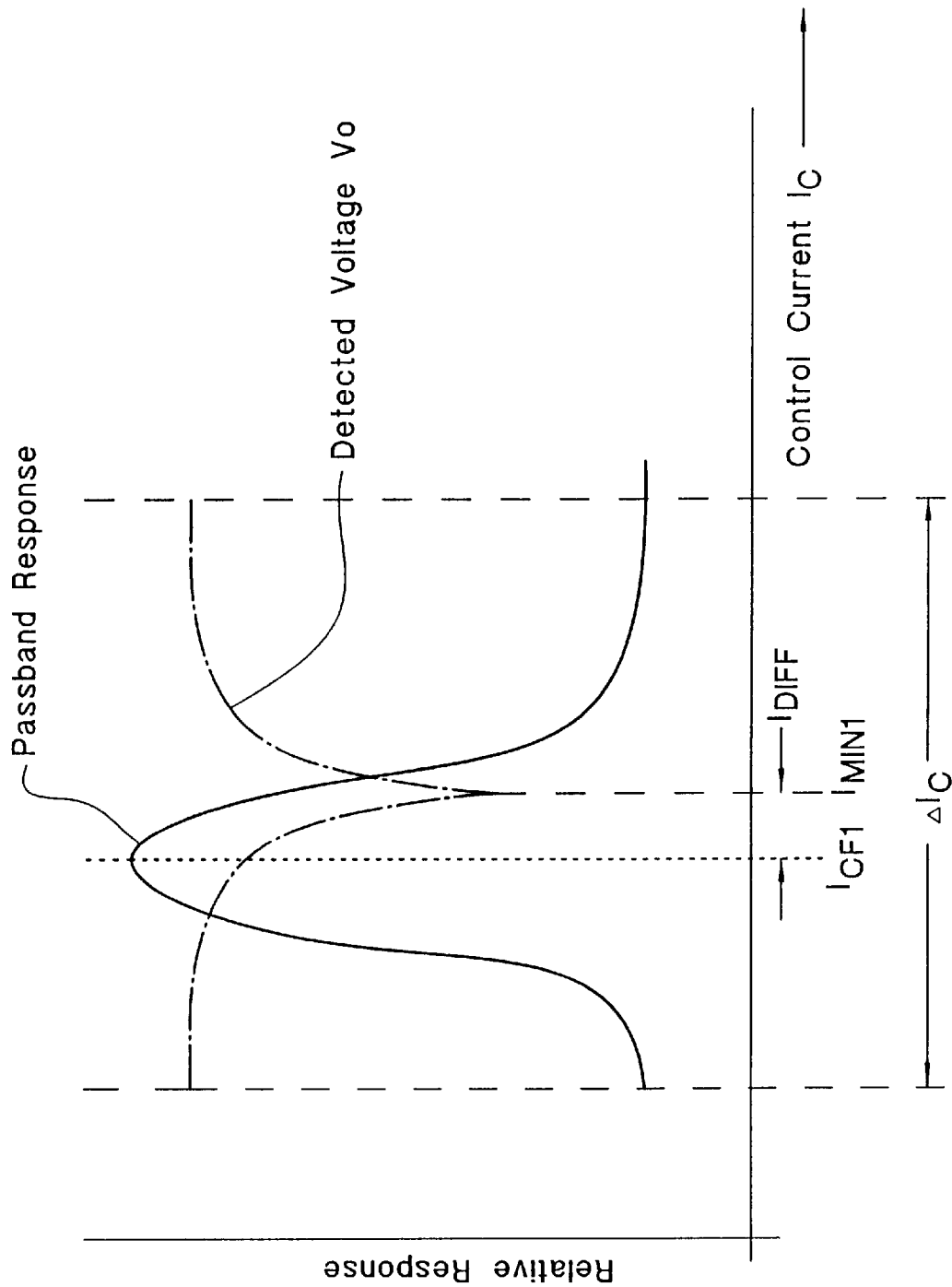
FIGS. 3A and 3B show detected reflection responses and passband responses of the YTF.

FIG. 3A shows the detected voltage response and the passband response of the YTF 20 at a baseline temperature as the control current $I_c$ is varied about a target level $I_{CF1}$ within a predefined current range $\Delta I_c$. The target level $I_{CF1}$ corresponds to the frequency of the local oscillator signal 13 and is determined from the tuning characteristic of trace T1 (shown in FIG. 2) stored in memory during the baseline characterization of the spectrum analyzer. At the target level $I_{CF1}$, the center frequency of the YTF 20 is equal to the frequency of the local oscillator signal 13. The minimum of the detected voltage $V_o$ occurs at a control current level $I_{MIN1}$ which is offset from the target level $I_{CF1}$ by an offset current $I_{DIFF}$. The offset current $I_{DIFF}$ at one or more frequencies of the local oscillator signal 13 is obtained and recorded during the baseline characterization.

Figure 3B:
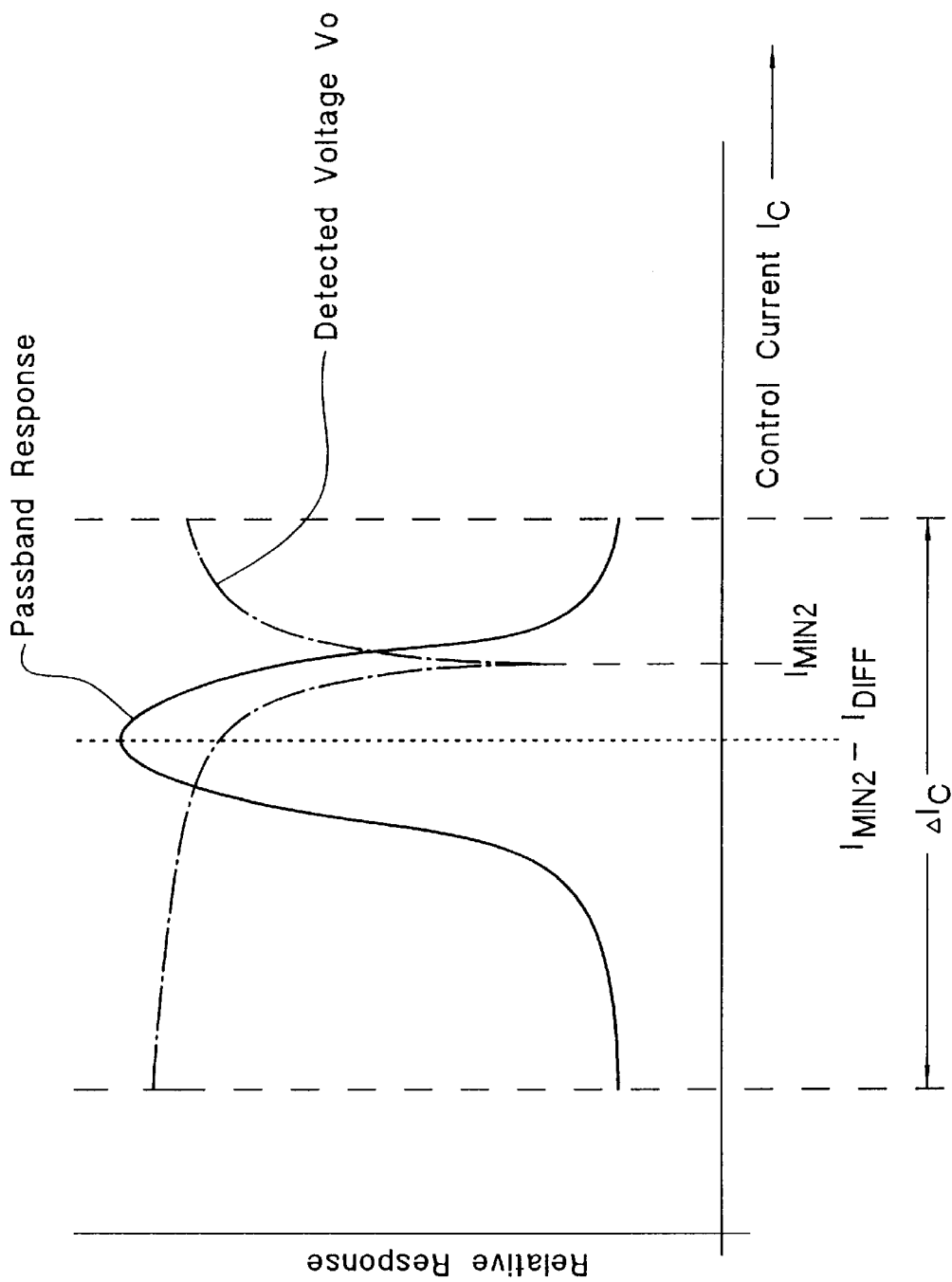

FIG. 3B shows the detected voltage response and the passband response of the YTF 20 at an operating temperature that is different from the baseline temperature of FIG. 3A, as the control current $I_c$ is varied about the target level $I_{CF1}$ within the predefined current range $\Delta I_c$. The minimum of the detected voltage $V_o$ occurs at control current level $I_{MIN2}$. The control current $I_c$ necessary to adjust the center frequency of YTF 20 to equal the frequency of the local oscillator signal 13 is $I_{MIN2}$ minus the offset current $I_{DIFF}$ for the example shown in which $I_{CF1}$ is less than $I_{MIN1}$ and is $I_{MIN2}$ plus the offset current $I_{DIFF}$ when $I_{CF1}$ is greater than $I_{MIN1}$. The tuning characteristic of trace T1 (shown in FIG. 2), acquired during baseline characterization of the spectrum analyzer at the baseline temperature is corrected to correspond to the tuning characteristic of the YTF at the operating temperature (shown in trace T2 of FIG. 2) by detecting the control current level $I_{MIN2}$ at the operating temperature and correcting the control current level $I_{MIN2}$ by the offset current $I_{DIFF}$. In this example the minimum of the detected voltage response, that is the minimum detected voltage $V_o$, is used to determine the control current levels $I_{MIN1}$ and $I_{MIN2}$. Alternatively, other characteristics of the detected voltage response are used to determine the control current levels $I_{MIN1}$ and $I_{MIN2}$. The minimum of the detected voltage response shown in FIGS. 3A and 3B, occurs when the reflected signal 19 has a maximum amplitude when the detected voltage $V_o$ provided by the mixer 16 is negative. Alternatively, when the detected voltage $V_o$ provided by the mixer 16 is positive, a maximum in the detected voltage occurs when the reflected signal has a maximum amplitude.

Figure 4:
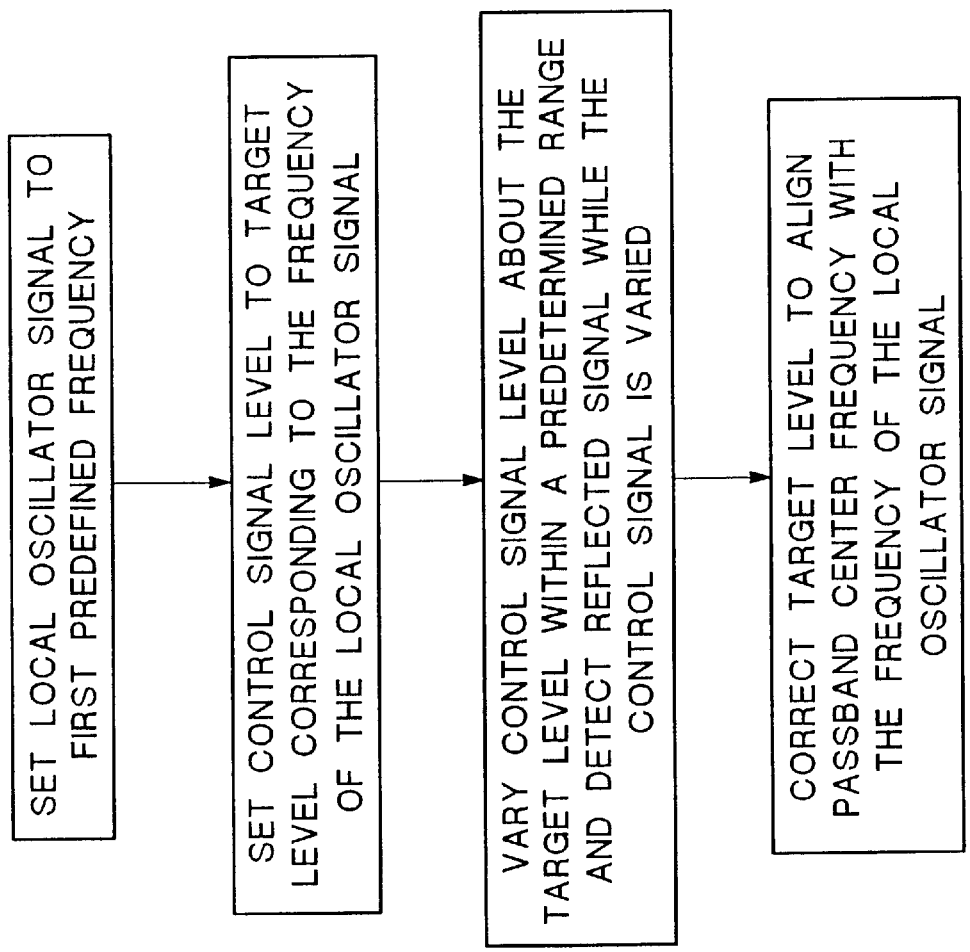
FIG. 4 is a flow diagram of calibration steps implemented using the filter calibration system of FIG. 1.

FIG. 4 shows a flow diagram 40 of calibration steps implemented by the filter calibration system 10 when the spectrum analyzer is in the calibration mode. During the baseline characterization of the spectrum analyzer (not shown) at a baseline temperature and baseline operating parameters, the tuning characteristic of the YTF 20 (shown in trace T1 of FIG. 2) is stored in memory. The offset current $I_{DIFF}$ (shown in FIG. 3A) at one or more predefined frequencies is also quantified during the baseline characterization. In step 42 of the flow diagram 40, the frequency of the local oscillator 18 is set to a first predefined frequency F1. The local oscillator 18 provides the stimulus signal 17 to the output port 2 of the YTF 20. In this example, the first predefined frequency F1 is equal to 3 GHz. In step 44, the control current $I_c$ is set to a target level $I_{CF1}$ corresponding to the first predefined frequency F1. The target level $I_{CF1}$ is obtained from the tuning characteristic of trace T1 stored in memory during the baseline characterization. In step 46, the control current $I_c$ is varied about the target level $I_{CF1}$ within a predefined current range $\Delta I_c$ and the reflected signal 19 is detected to produce a detected voltage response. The detected voltage $V_o$ at various control current levels within the current range $\Delta I_c$ is recorded. Alternatively, the control current $I_c$ is set to the target level $I_{CF1}$ while the frequency of the stimulus signal 17 is varied within a predetermined range about the predefined frequency F1 to produce the detected voltage response. In step 48, the recorded response is used to extract the control current level $I_{MIN2}$. The control current level $I_{MIN2}$ is corrected by $I_{DIFF}$, to adjust the passband center frequency of the YTF 20 to equal the frequency of the local oscillator signal 13.

By performing the calibration steps 42–48 in flow diagram 40 at a second predefined frequency F2 within the tuning range of the YTF 20, such as 7 GHz, the corrected tuning characteristic of trace T2 are extrapolated since temperature changes and changes in operating parameters of the spectrum analyzer typically alter the slope and offset of the tuning characteristic of trace T1 while the shape of the tuning characteristic of trace T1 is maintained in trace T2. Thus, repeating the calibration steps 42–48 at the second predefined frequency F2 is sufficient to correct for the slope and offset changes and to determine the tuning characteristic of trace T2. At the second predefined frequency F2 the control current $I_c$ is set to a target level $I_{CF2}$ corresponding to the second predefined frequency F2 and obtained from the tuning characteristic of trace T1 stored in memory during the baseline characterization.

While the preferred embodiment of the present invention has been illustrated in detail, it should be apparent that modifications and adaptations to the embodiment may occur to one skilled in the art without departing from the scope of the present invention as set forth in the following claims.

What is claimed is:

1. A filter calibration system for a tuned filter having a passband center frequency adjustable according to an applied control signal, comprising:

an oscillator providing a stimulus signal;

a mixer having three ports, the mixer coupled to the oscillator at the first port and coupled to an output of the tuned filter at the second port, the first port receiving the stimulus signal and passing the stimulus signal to the second port, the stimulus signal producing a reflected signal at the output of the tuned filter and a transmitted signal at an input of the tuned filter, the mixer detecting the reflected signal at the second port and producing a reflection response at the third port as the applied control signal is varied over a predetermined range whereby the passband center frequency of the tuned filter is mapped to the reflection response; and an attenuator coupled to the input of the tuned filter attenuating the transmitted signal.

2. The filter calibration system of claim 1 wherein the stimulus signal has a predefined frequency.

3. The filter calibration system of claim 2 wherein reflected signal produces a minimum in the reflection response when the reflected signal has a maximum amplitude and the passband center frequency of the tuned filter is mapped to the minimum in the reflection response.

4. The filter calibration system of claim 3 wherein the passband center frequency of the tuned filter is mapped to the minimum in the reflection response by applying an offset to the control signal.

5. The filter calibration system of claim 2 wherein reflected signal produces a maximum in the reflection response when the reflected signal has a maximum amplitude and the passband center frequency of the tuned filter is mapped to the maximum in the reflection response.

6. The filter calibration system of claim 5 wherein the passband center frequency of the tuned filter is mapped to the maximum in the reflection response by applying an offset to the control signal.

7. A filter calibration system for a tuned filter having a passband center frequency adjustable according to an applied control signal, comprising:

an oscillator providing a stimulus signal;

a mixer having three ports, the mixer coupled to the oscillator at the first port and coupled to an output of the tuned filter at the second port, the first port receiving the stimulus signal and passing the stimulus signal to the second port, the stimulus signal producing a reflected signal at the output of the tuned filter and a transmitted signal at an input of the tuned filter, the mixer detecting the reflected signal at the second port and producing a reflection response at the third port as the frequency of the stimulus signal is varied over a predefined frequency range whereby the passband center frequency of the tuned filter is mapped to the reflection response; and an attenuator coupled to the input of the tuned filter attenuating the transmitted signal.

8. The filter calibration system of claim 7 wherein the applied control signal is set to a predefined level.

9. The filter calibration system of claim 8 wherein reflected signal produces a minimum in the reflection response when the reflected signal has a maximum amplitude and the passband center frequency of the tuned filter is mapped to the minimum in the reflection response.

10. The filter calibration system of claim 9 wherein the passband center frequency of the tuned filter is mapped to the minimum in the reflection response by applying an offset to the control signal.

11. The filter calibration system of claim 8 wherein reflected signal produces a maximum in the reflection response when the reflected signal has a maximum amplitude and the passband center frequency of the tuned filter is mapped to the maximum in the reflection response.

12. The filter calibration system of claim 11 wherein the passband center frequency of the tuned filter is mapped to the maximum in the reflection response by applying an offset to the control signal.

13. A calibration method implemented by a filter calibration system for a tuned filter having a passband center frequency adjustable according to an applied control signal, the method comprising the steps of:

applying a stimulus signal at a predefined frequency to the tuned filter;

adjusting the applied control signal to a target level;

varying the control signal within a predetermined range about the target level;

detecting a reflected signal produced while the stimulus signal is applied to the tuned filter and while the control signal is varied to form a reflection response for the tuned filter; and correcting the level of the applied control signal according to the reflection response to adjust the passband center frequency to equal the predefined frequency.

14. The method of claim 13 wherein the step of correcting the level of the applied control signal includes applying an offset to the target level of the applied control signal.

15. The method of claim 14 wherein the offset to the applied control signal is determined by performing a baseline calibration to establish a relationship between the passband center frequency of the tuned filter and the reflection response for the tuned filter at the predefined frequency.

16. The method of claim 14 wherein the target level of the control signal is determined by applying a signal to the tuned filter at predefined frequency and adjusting the applied control signal until transmission through the tuned filter is maximized.

17. A calibration method implemented by a filter calibration system for a tuned filter having a passband center frequency adjustable according to an applied control signal, the method comprising the steps of:

adjusting the applied control signal to a target level;

applying a stimulus signal at a predefined frequency to the tuned filter;

varying the frequency of the stimulus signal within a predetermined frequency range about the predefined frequency;

detecting a reflected signal produced while the stimulus signal is applied to the tuned filter and while the frequency of the stimulus is varied to form a reflection response for the tuned filter; and correcting the level of the applied control signal according to the reflection response to adjust the passband center frequency to equal the predefined frequency.

18. The method of claim 17 wherein the step of correcting the level of the applied control signal includes applying an offset to the target level of the applied control signal.

19. The method of claim 18 wherein the offset to the applied control signal is determined by performing a baseline calibration to establish a relationship between the passband center frequency of the tuned filter and the reflection response for the tuned filter at the predefined frequency.

20. The method of claim 14 wherein the target level of the control signal is determined by applying a signal to the tuned filter at predefined frequency and adjusting the applied control signal until transmission through the tuned filter is maximized.

* * * * *